US006642804B2

United States Patent
Chrissostomidis et al.

(10) Patent No.: US 6,642,804 B2
(45) Date of Patent: Nov. 4, 2003

(54) OSCILLATOR CIRCUIT

(75) Inventors: Ioannis Chrissostomidis, München (DE); Thoai-Thai Le, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/074,578

(22) Filed: Feb. 13, 2002

(65) Prior Publication Data

US 2002/0121940 A1 Sep. 5, 2002

(30) Foreign Application Priority Data

Feb. 13, 2001 (DE) .......................... 101 06 486

(51) Int. Cl.[7] .............................................. H03L 7/00
(52) U.S. Cl. ...................................... 331/143; 331/111
(58) Field of Search ............................. 331/36 C, 111, 331/143, 145, 74

(56) References Cited

U.S. PATENT DOCUMENTS

| | | | |
|---|---|---|---|
| 5,638,031 A | | 6/1997 | Danstrom |
| 5,668,508 A | * | 9/1997 | Pulvirenti et al. .......... 331/111 |
| 6,211,746 B1 | * | 4/2001 | Segawa et al. ............. 331/143 |
| 6,229,350 B1 | * | 5/2001 | Ricon-Mora ................ 327/77 |
| 6,404,252 B1 | * | 6/2002 | Wilsch ....................... 327/198 |
| 6,456,170 B1 | * | 9/2002 | Segawa et al. ............. 331/143 |

FOREIGN PATENT DOCUMENTS

| | | |
|---|---|---|
| DE | 4340924 C2 | 6/1995 |
| DE | 19626102 A1 | 1/1997 |
| DE | 69514090 T2 | 5/2000 |
| JP | 2000337336 A | 7/1998 |
| JP | 2000349598 A | 1/1999 |

* cited by examiner

*Primary Examiner*—Henry Choe

(57) ABSTRACT

The invention creates an oscillator circuit, in particular for a refresh timer device of a dynamic semiconductor memory, having a capacitor device (C; C') which is connected between a first node (6) and a first supply potential (P2); a current mirror circuit (T1; T2) for supplying a charging current for the capacitor device (C; C') which is connected via a first transistor device (T4) to the first node (6) and which has a current source (SQ) for supplying a substantially temperature-independent reference current (Iref); a second transistor device (T5), which is connected between the first node (6) and the first supply potential (P2); the first and second transistor devices (T4; T5) and a control signal being configured in such a way that the capacitor device (C; C') can be charged via the first node (6) when a potential (Vcomp) at the first node (6) is lower than the reference potential (Vref), and can be discharged via the first node (6) when the potential (Vcomp) at the first node (6) is higher than the reference potential (Vref) such that the signal at an output (A) oscillates.

7 Claims, 2 Drawing Sheets

OSCILLATOR CIRCUIT

RELATED APPLICATIONS

This application claims priority from German Patent Application No. 101 06 486.1, filed Feb. 13, 2001, the disclosure of which is incorporated herein by reference in its entirety.

FIELD OF THE INVENTION

The present invention relates to an oscillator circuit, and in particular to an oscillator circuit for a refresh timer device of a dynamic semiconductor memory.

BACKGROUND OF THE INVENTION

Although they can be applied to any desired oscillator circuit, the present invention and the problems on which it is based will be explained with the aid of an oscillator circuit for a refresh timer device of a dynamic semiconductor memory.

In the case of dynamic semiconductor memories such as a DRAM, the binary information is stored in the cells as a different charge quantity. Since this charge is reduced with time by leakage currents, after expiry of a "refresh time" it is necessary for the information of the memory cells to be written back again. This therefore requires the generation of an oscillating clock signal for the refresh cycles and the possibility of adjusting the required refresh time.

FIG. 2 shows a schematic illustration of an oscillator circuit for the purpose of explaining the problems on which the invention is based.

In FIG. 2, T1, T2, T4, T6 denote a respective p-channel transistor device, and T3, T5 a respective n-channel transistor device, P1 and P2 a respective supply potential, 1 to 8 respective circuit nodes, Vref a reference potential, EN an activation signal, OSC an oscillator signal, Vcomp a potential at the node 6, COMP a comparator with a first input +, a second input − and an output A, INV an inverter, L1 a feedback line, C and C' a respective capacitor, FU a fuse, R a resistor, and G1 an inverting AND gate with inputs E1, E2 and an output A'.

The node 6 is a charging/discharging node for the capacitor device consisting of two capacitors C, C', it being possible to decouple the capacitor C' by severing the fuse FU. This ability to decouple the capacitor C' or further such capacitors appended via an appropriate fuse permits fine frequency tuning.

Charging the capacitor device C, C' is performed via two component currents, specifically a first component current which is supplied by the current mirror circuit with the transistor devices T1, T2, and a second component current, which is fed via the transistor device T6 and the resistor R into the node 8 in from there into the node 6. The potential at the node 6 is applied to the comparator COMP as potential Vcomp and compared there with the reference potential Vref. The signal at the output A is either logic "1" or "0", depending on the comparison. This output signal A is inverted by the inverter INV and fed into the node 7. At the same time it is the oscillating output signal OSC of the oscillator circuit.

Via the feedback line L1, this signal OSC is led to the input E2 of the inverting AND gate G1, at whose other input E1 the activation signal EN is present. This activation signal EN serves, in particular, for triggering or initializing the entire circuit. Specifically, the gate G1 behaves like an inverter when the activation signal is switched from logic "0" to "1".

The result of this is that, depending on the logic state of the signal at the node 7, either the capacitor device C, C' is charged via the two component currents, which come from the current mirror T1, T2 or from the resistor R or it is discharged via the transistor device T5.

In the first case, the transistor device T5 is turned off and the transistor devices T4, T6 are turned on, and in the second case the transistor device T5 is turned on and the transistor devices T4, TG are turned off.

This oscillator circuit is, however, susceptible to temperature fluctuations and process fluctuations, since the turn-on voltage of the transistor device T3 can be influenced strongly by these fluctuations. Consequently, the resistor R is selected in such a way that, as it were, it counteracts temperature fluctuations in the turn-on voltage of the transistor device T3. In other words, the current flowing through the resistor R is increased when the turn-on voltage of the transistor device T3 is raised, and vice versa.

The said process fluctuations can be compensated to a certain extent by tuning the capacitor device C, C'. However, a grave disadvantage of this concept lies in that the temperature responses of the two component currents cannot be sensibly compensated. The oscillator frequency is thereby strongly dependent on the temperature.

SUMMARY OF THE INVENTION

The object on which the present invention is based consists in creating an improved oscillator circuit whose oscillator frequency substantially no longer exhibits a disturbing temperature response.

This object is achieved by means of the oscillator circuit specified in claim 1.

The idea on which the present invention is based resides in the fact that a current mirror circuit is present for supplying a charging current for the capacitor device, which device is connected to the charging/discharging node via first transistor device and which has a current source for supplying a substantially temperature-independent reference current. Since, in accordance with the invention, a reference current is used which is not a function of temperature, the clock frequency adjusted is constant over temperature. Neither can process fluctuations any longer come to bear.

Preferred developments are the subject matter of the subclaims.

In accordance with a preferred development, the control signal generating device has a feedback loop for feeding back the signal at the output to a control terminal of the first transistor device and to a control terminal of the second transistor device.

In accordance with a further preferred development, the capacitor device has a first and at least one second capacitor, the at least one second capacitor being connected to the first node via a fuse. Of course, a plurality of second capacitors can also be connected via a respective fuse in order thus to permit fine frequency tuning.

In accordance with a further preferred development, the feedback loop has an inverting device for inverting the signal at the output, and a feedback line for feeding back the inverted signal to the control terminal of the first transistor device and to the control terminal of the second transistor device, and the first and second transistor devices have a complementary making/breaking capacity.

In accordance with a further preferred development, the feedback loop has a first gate device with a first and a second input and an output, it being possible to feed the first input an activation signal, and the second input being connected to the feedback line, and it being possible to apply the signal at the output to the control terminal of the first transistor device and to the control terminal of the second transistor device.

In accordance with a further preferred development, the current mirror circuit has a third and a fourth transistor device whose respective first main terminals are connected to a second supply potential and whose control terminals are connected to one another, the second main terminal of the third transistor device being connected to the current source and to the interconnected control terminals, and the second main terminal of the fourth transistor device being connected to the first node via the first transistor device.

In accordance with a further preferred development, the current source can be adjusted or trimmed, and this can be achieved, for example, via trimming resistors.

BRIEF DESCRIPTION OF THE DRAWINGS

The present invention is explained below with the aid of a preferred exemplary embodiment with reference to the accompanying drawings, in which.

DETAILED DESCRIPTION OF PREFERRED EMBODIMENTS

Identical reference symbols in the figures and/or description denote identical or functionally identical elements.

Figure 1:
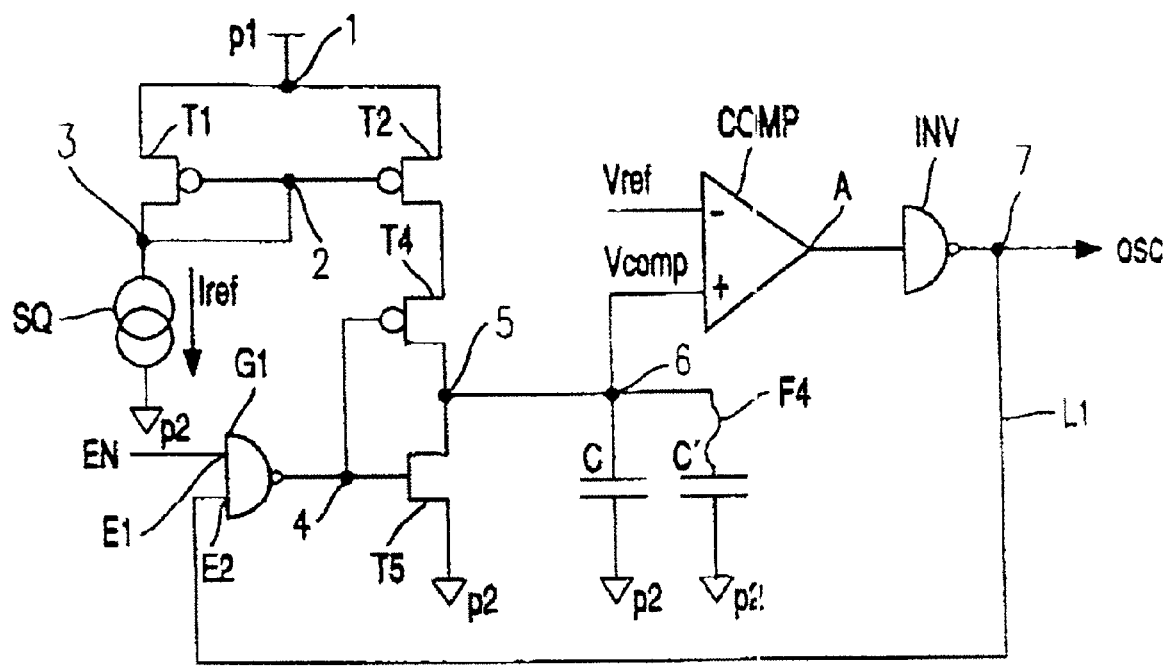
FIG. 1 shows a schematic illustration of an oscillator circuit in accordance with an embodiment of the present invention.

FIG. 1 shows a schematic illustration of an oscillator circuit in accordance with an embodiment of the present invention.

In addition to the reference symbols already introduced, in FIG. 1 SQ denotes a current source for supplying a substantial temperature-independent reference current Iref. The current source SQ replaces the transistor device T3 driven by the reference potential Vref in accordance with FIG. 2.

The illustrated embodiment also no longer includes the transistor device T6 for supplying a current component via the resistor R with the nonlinear temperature response.

In the embodiment shown, the current source SQ, which supplies the constant reference current Iref, is situated between the node 3 and the supply potential P2. As a consequence thereof, neither temperature fluctuations nor process fluctuations can influence the charging current of the capacitor device C, C'.

In other words, in the case of the embodiment shown the charging current at the node 6 now only has a component which is delivered from the current mirror circuit via the transistor device T4. The additional outlay on implementing this security concept is low when use is made of a similar reference current by other circuits on the relevant [lacuna], for example a receiver circuit.

Again, information for trimming the current source SQ can be obtained by means of a frequency measurement of the oscillator signal OSC while taking account of the adjusted capacitance, it being possible to perform this trimming by means of trimming resistors (not illustrated). Specifically, in practice it is less complicated to carry out a frequency measurement than a current measurement.

This circuitry concept can be used wherever there is a need for a relatively long time-delay element. It helps in implementing a process- and temperature-independent self-refresh timer, and also in an improved adjustment of the reference current.

Figure 2:
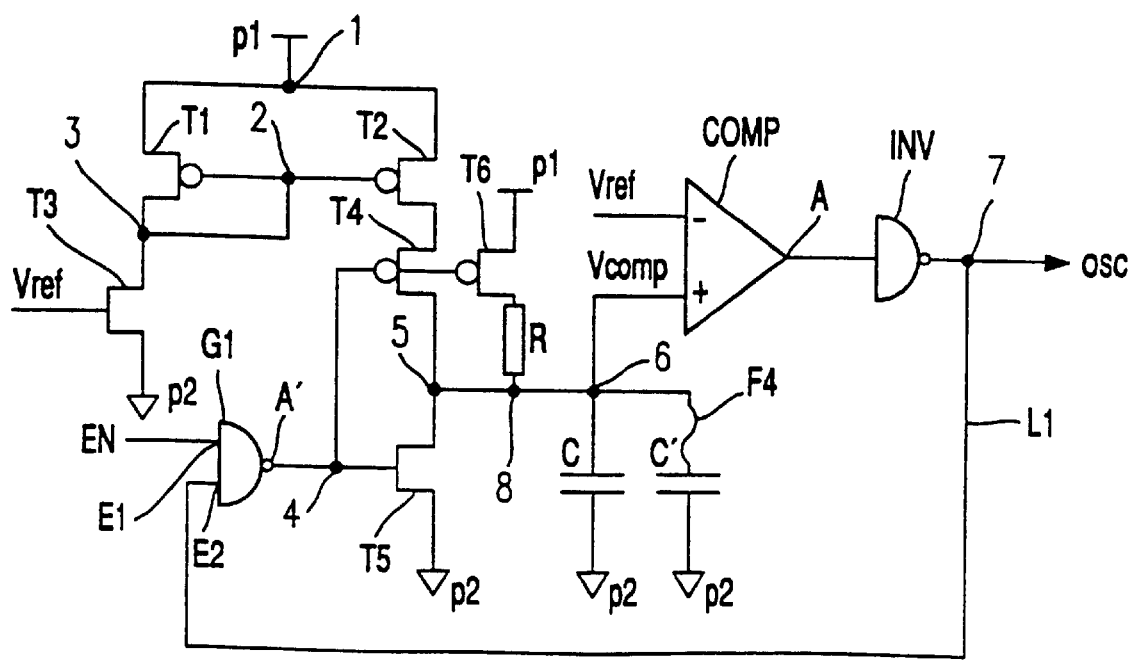
FIG. 2 shows a schematic illustration of an oscillator circuit for the purpose of explaining the problems on which the invention is based.

Otherwise, the functions of the circuit in accordance with the embodiment according to FIG. 1 are similar, as described with reference to the circuit in accordance with FIG. 2.

Although the present invention has been described above with the aid of preferred exemplary embodiments, it is not limited thereto, but can be modified in multifarious ways.

In particular, the oscillator circuit can be applied not only for a refresh timer device of a dynamic semiconductor memory, but in any desired circuits. Again, there is no absolute need for a feedback loop for generating the control signal for the transistor devices T4, T5; rather, the provision of an appropriate external control signal is also sufficient.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An oscillator circuit for a refresh timer device of a dynamic semiconductor memory, the oscillator circuit comprising:

a capacitor device which is connected between a first node and a first supply potential;

a current mirror circuit for supplying a charging current for the capacitor device which is connected via a first transistor device to the first node and which has a current source for supplying a substantially temperature-independent reference current;

a second transistor device, which is connected between the first node and the first supply potential;

a comparator device with a first input and a second input and an output, the first input being connected to the first node and the second input being connected to a reference potential; and a control signal generating device for generating a control signal for applying to a control terminal on the first transistor device and to a control terminal on the second transistor device;

the first and second transistor devices and the control signal being configured in such a way that the capacitor device can be charged via the first node when a potential at the first node is lower than the reference potential, and can be discharged via the first node when the potential at the first node is higher than the reference potential such that the signal at the output oscillates.

2. An oscillator circuit according to claim 1, wherein the control signal generating device has a feedback loop for feeding back the signal at the output to a control terminal of the first transistor device and to a control terminal of the second transistor device.

3. An oscillator circuit according to claim 1 wherein the capacitor device has a first and a second capacitor, and the second capacitor can be connected to the first node via a fuse.

4. An oscillator circuit according to claim 2, wherein the feedback loop has an inverting device for inverting the signal at the output, and a feedback line for feeding back the inverted signal to the control terminal of the first transistor device and to the control terminal of the second transistor device, and in that the first and second transistor devices have a complementary making/breaking capacity.

5. An oscillator circuit according to claim 4, wherein the feedback loop has a first gate device with a first and a second input and an output, it being possible to feed the first input an activation signal, and the second input being connected to the feedback line; and in that the signal at the output can be applied to the control terminal of the first transistor device and to the control terminal of the second transistor device.

6. An oscillator circuit according to claim 1, wherein the current mirror circuit has a third and a fourth transistor device whose respective first main terminals are connected to a second supply potential and whose control terminals are connected to one another, the second main terminal of the third transistor device being connected to the current source and to the interconnected control terminals, and the second main terminal of the fourth transistor device being connected to the first node via the first transistor device.

7. An oscillator circuit according to claim 1, wherein the current source can be adjusted.

* * * * *